United States Patent
Hill

(10) Patent No.: US 12,106,939 B2
(45) Date of Patent: *Oct. 1, 2024

(54) SYSTEMS AND METHODS OF PLASMA GENERATION WITH MICROWAVES

(71) Applicant: Plasma Flow, LLC, Lafayette, CO (US)

(72) Inventor: Garrett Hill, Boulder, CO (US)

(73) Assignee: Rimere, LLC, Lafayette, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/094,020

(22) Filed: Jan. 6, 2023

(65) Prior Publication Data
US 2023/0225042 A1 Jul. 13, 2023

Related U.S. Application Data

(63) Continuation of application No. 17/830,921, filed on Jun. 2, 2022, now Pat. No. 11,551,910.
(Continued)

(51) Int. Cl.
*H01J 37/32* (2006.01)
*H05H 1/46* (2006.01)

(52) U.S. Cl.
CPC .. *H01J 37/32229* (2013.01); *H01J 37/32568* (2013.01); *H05H 1/4622* (2021.05); *H05H 2245/10* (2021.05)

(58) Field of Classification Search
None
See application file for complete search history.

(56) References Cited

U.S. PATENT DOCUMENTS 4,584,920 A 4/1986 Hoog et al.
4,939,424 A * 7/1990 Kieser .................. C23C 16/511
315/111.41
(Continued)

FOREIGN PATENT DOCUMENTS

CN 101844744 3/2012
CN 205812485 12/2016
(Continued)

OTHER PUBLICATIONS

International Search Report and Written Opinion for International Patent Application No. PCT/US2022/031962, dated Sep. 27, 2022, 14 pages.

*Primary Examiner* — Srinivas Sathiraju
(74) *Attorney, Agent, or Firm* — Fish IP Law, LLP

(57) ABSTRACT

Plasma generators and methods of generating plasma are disclosed. Electrodes in a reaction zone are energized by a high voltage power source that is electrically insulated from the electrodes. A first conductor array, preferably a coil, is electrically coupled to the power source and electrically insulated from the electrodes. A second conductor array, preferably a coaxial coil nested within the first conductor array, is electrically coupled to the electrodes. Electromagnetic induction between the first conductor array and the second conductor array is used to energize the electrodes and generate a plasma in the reaction zone. One or more microwaves are further directed at the plasma to form microwave plasma, either in parallel or in series. Such plasmas are used to reform a hydrocarbon feedstock into low C hydrocarbons, carbon, or hydrogen. Plasma generators combining induction plasma with serial microwave plasmas are further contemplated.

30 Claims, 14 Drawing Sheets

Related U.S. Application Data

(60) Provisional application No. 63/195,946, filed on Jun. 2, 2021.

(56) References Cited

U.S. PATENT DOCUMENTS

| | | | |
|---|---|---|---|
| 5,003,152 A * | 3/1991 | Matsuo | C23C 16/511 |
| | | | 118/723 R |
| 5,010,276 A * | 4/1991 | Echizen | H01J 37/32192 |
| | | | 315/111.21 |
| 5,993,761 A | 11/1999 | Czernichowski et al. | |
| 6,130,399 A | 8/2000 | Lu et al. | |
| 6,158,384 A | 12/2000 | Ye et al. | |
| 6,176,078 B1 | 1/2001 | Balko et al. | |
| 6,190,507 B1 | 2/2001 | Whealton et al. | |
| 6,944,830 B2 | 9/2005 | Card et al. | |
| 7,025,939 B1 | 4/2006 | Hall et al. | |
| 8,272,206 B2 | 9/2012 | Lee et al. | |
| 9,241,396 B2 | 1/2016 | Foret | |
| 9,393,543 B2 * | 7/2016 | Novoselov | C10G 50/00 |
| 9,889,218 B2 | 2/2018 | Morfill et al. | |
| 10,188,119 B2 | 1/2019 | Foret | |
| 10,293,303 B2 | 5/2019 | Hill | |
| 10,308,512 B2 | 6/2019 | Tanner et al. | |
| 10,987,735 B2 * | 4/2021 | Hadidi | B22F 9/08 |
| 2003/0140622 A1 | 7/2003 | Taylor, III et al. | |
| 2004/0134890 A1 | 7/2004 | Uhm et al. | |
| 2005/0208446 A1 | 9/2005 | Jayne | |
| 2005/0236374 A1 * | 10/2005 | Blankenship | B23K 35/40 |
| | | | 219/121.11 |
| 2005/0255011 A1 | 11/2005 | Greathouse et al. | |
| 2006/0070372 A1 | 4/2006 | Lucas et al. | |
| 2006/0185352 A1 | 8/2006 | Twigg | |
| 2006/0201139 A1 | 9/2006 | Khadiya | |
| 2008/0276600 A1 | 11/2008 | Lee et al. | |
| 2009/0165953 A1 | 4/2009 | Seeley et al. | |
| 2009/0129993 A1 | 5/2009 | Kim et al. | |
| 2010/0135879 A1 | 6/2010 | Roesch et al. | |
| 2012/0073756 A1 * | 3/2012 | Yamazawa | H01J 37/3211 |
| | | | 156/345.48 |
| 2014/0021035 A1 | 1/2014 | Rabinovich et al. | |
| 2014/0191450 A1 * | 7/2014 | Boyman | C22B 4/08 |
| | | | 266/200 |
| 2014/0209243 A1 * | 7/2014 | Kim | H01J 37/32091 |
| | | | 156/345.34 |
| 2016/0295676 A1 | 10/2016 | Patelli et al. | |
| 2017/0145890 A1 | 5/2017 | Hill et al. | |
| 2018/0297122 A1 * | 10/2018 | Hadidi | B22F 9/14 |
| 2019/0046947 A1 | 2/2019 | Strohm et al. | |
| 2019/0047865 A1 | 2/2019 | Zeller et al. | |
| 2019/0177835 A1 * | 6/2019 | Baduvamanda | H01J 37/321 |
| 2020/0312639 A1 * | 10/2020 | Tom | G01J 1/0425 |
| 2020/0402768 A1 | 12/2020 | Stowell et al. | |
| 2022/0021290 A1 * | 1/2022 | Mills | H02K 44/10 |

FOREIGN PATENT DOCUMENTS

| | | | | |
|---|---|---|---|---|
| DE | 102011077788 | | 12/2012 | |
| GB | 2274412 | | 7/1994 | |
| GB | 2282738 | | 12/1995 | |
| JP | 2011086912 A | * | 4/2011 | C23C 16/4412 |
| JP | 5648349 B2 | * | 1/2015 | C23C 16/4412 |
| KR | 20160097438 A | | 8/2016 | |
| WO | 2000043102 | | 7/2000 | |
| WO | 2001092694 | | 6/2001 | |
| WO | WO-2011033927 A1 | * | 3/2011 | C23C 16/4412 |
| WO | WO2021113496 | | 6/2022 | |

* cited by examiner

SYSTEMS AND METHODS OF PLASMA GENERATION WITH MICROWAVES

This application claims the benefit of priority to U.S. patent application Ser. No. 17/830,921 filed on Jun. 2, 2022, which claims the benefit of priority to U.S. provisional application No. 63/195,946 filed on Jun. 2, 2021. This and all other extrinsic references referenced herein are incorporated by reference in their entirety.

FIELD OF THE INVENTION

The field of the invention is plasma systems.

BACKGROUND

The background description includes information that may be useful in understanding the present invention. It is not an admission that any of the information provided herein is prior art or relevant to the presently claimed invention, or that any publication specifically or implicitly referenced is prior art.

All publications herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

It is increasingly becoming more desirable to process or reform fluids, gases, are contents thereof using plasmas. For example, plasmas can be applied to hydrocarbon feedstocks to advantageously generate lighter hydrocarbons, carbon, or hydrogen. Such systems can use one or more plasmas, or multiple types of plasmas. These high energy systems are unfavorable susceptible to electric feedback or interference which can damage parts of the system or one or more power sources. It does not appear that economical, robust, or commercially practical solutions exist to prevent such damaging feedback or interference.

Thus, there remains a need for a system and method that improves the durability or performance of plasma devices for reforming fluids or gases.

SUMMARY OF THE INVENTION

Plasma generators are disclosed. A reaction zone has a first electrode, and a low-turn coil outside the reaction zone. A high-turn coil is disposed within the low-turn coil and electrically coupled to the first electrode. The high-turn coil typically has a higher turn count than the low-turn coil. A microwave emitter is further directed at the reaction zone.

Induction systems or components of the inventive subject matter are described in U.S. Provisional Patent Application No. 62/942,986 and International Application No. PCT/US2020/063088, both of which are incorporated by reference in their entirety.

In some embodiments, the low-turn coil is electrically insulated from the first electrode, for example by a dielectric material. Preferably, the low-turn coil is electrically coupled to a high-voltage power supply.

The high-turn coil is disposed outside the reaction zone, in some embodiments separated from the reaction zone by a wall, though the high-turn coil can also be disposed within the reaction zone. For example, the high-turn coil can be encapsulated in a closed container comprising a high dielectric strength insulating material. Such high dielectric strength insulating substance include glass, quartz, transformer oil, insulated magnetic particles, ferroelectric particles, or tar. In some embodiments, the high-turn coil is electrically coupled to the first electrode by a conductive feedthrough which protrudes into the inner chamber.

In preferred embodiments, the low-turn coil and the high-turn coil are coaxial and extend along a common axis. A second electrode can be further disposed in the reaction zone, such that the first and second electrodes generate a plasma in the reaction zone. The first and second electrodes are preferably electrically insulated from the low-turn coil. A power source is further electrically coupled to the low-turn coil, and in some embodiments electrically insulated from the first electrode. The microwave emitter is typically directed at the plasma in the reaction zone.

Further plasma generators are contemplated. A reaction zone includes a first electrode, and a primary conductor array is disposed outside the reaction zone. The primary conductor array is preferably electrically insulated from the first electrode. A secondary conductor array is electrically coupled to the first electrode, and a microwave emitter is directed at or toward the reaction zone. The first electrode is typically electrically coupled with the secondary conductor array, and in some embodiments is the secondary conductor array, or at least a portion thereof.

The primary conductor array is typically arranged in a pattern, for example a spiral, coil, concentric circles, ovals, triangles, quadrilaterals, higher order polygons, irregular shapes, or combinations thereof, and can extend or propagate radially or coaxially. The secondary conductor array is preferably arranged in a pattern that mirrors or approximates the pattern of the primary conductor array. In some embodiments, the secondary conductor array is arranged in a pattern more dense than the pattern of the primary conductor array, for example with less space between each portion of the array when compared to the primary conductor array. It is contemplated that a current passing through the primary conductor array induces a current in the secondary conductor array.

In some embodiments the primary conductor array includes a first coil and the secondary conductor array includes a second coil, and preferably such that the second coil has a greater turn-count than the first coil. Favorably, the first coil and the second coil are coaxial and extend along a common axis. A second electrode can further be disposed in the reaction zone, such that the first and second electrodes generate a plasma, either individually or in combination. The first and second electrodes are preferably electrically insulated from the primary conductor array. A power source is further electrically coupled to the primary conductor array and electrically insulated from the first electrode.

Further plasma generators are contemplated. A reaction zone has a first electrode, and a wave emitter is directed at the reaction zone. A power source energizes the first electrode and yet is electrically insulated from the first electrode. The first electrode is typically grounded.

In some embodiments it is contemplated the power source energizes the first electrode via electromagnetic induction between a first conductor array and a second conductor array, where the first conductor array is electrically coupled to the power source and the second conductor array is electrically coupled to the first electrode. In preferred embodiments, the second conductor array, or at least the first electrode, or both, are electrically insulated from the power source. It is further contemplated the first conductor array is electrically coupled to the power source and electrically insulated from the first electrode. A second electrode can be further disposed in the reaction zone, such that the first and second electrodes generate a plasma. In some embodiments, the first and second electrodes are electrically insulated from the power source.

The wave emitter generates one of an acoustic wave, a gamma wave, an x-ray, a UV wave, an infrared wave, a microwave, or a radio wave, preferably directed at the reaction zone or the plasma.

While it is preferred to use electromagnetic induction to decouple an electrode from its power source to prevent electrical overload, influx, or interference, it is also contemplated alternative or additional methods can be used to enact such decoupling or otherwise shield the power source from damage. For example, a choke coil can be attached to the electrode to attenuate radio frequency (RF) propagating back to the power supply. Such methods still allow for direct current (DC) and low frequency waves to pass through. A ferrite rod can be placed in the center of the choke coil and another concentric coil can use the mutual inductance of the ferrite rod as a way to sense whether the choke could is attenuating RF or not in real-time.

Methods of generating a plasma are further contemplated. A power source is used to energize a first electrode, yet the first electrode is preferably electrically insulated from the power source. The energized first electrode is then used to generate a plasma. A wave is then directed at the plasma. The wave can be one of an acoustic wave, a gamma ray, an x-ray, a UV wave, an infrared wave, a microwave, or a radio wave, or combinations thereof. The wave can be directed by orienting the wave emitter or using a waveguide to direct the wave at the reaction zone or plasma.

A second electrode can further be used to generate the plasma. Preferably, the second electrode is electrically insulated from the power source, yet the power source energizes the second electrode. For example, energizing the first electrode employs electromagnetic induction between a first conductor array and a second conductor array, where the first conductor array is electrically coupled to the power source and the second conductor array is electrically coupled to the first electrode, and preferably insulated from each other.

Various objects, features, aspects and advantages of the inventive subject matter will become more apparent from the following detailed description of preferred embodiments, along with the accompanying drawing figures in which like numerals represent like components.

DETAILED DESCRIPTION

Figure 1A:
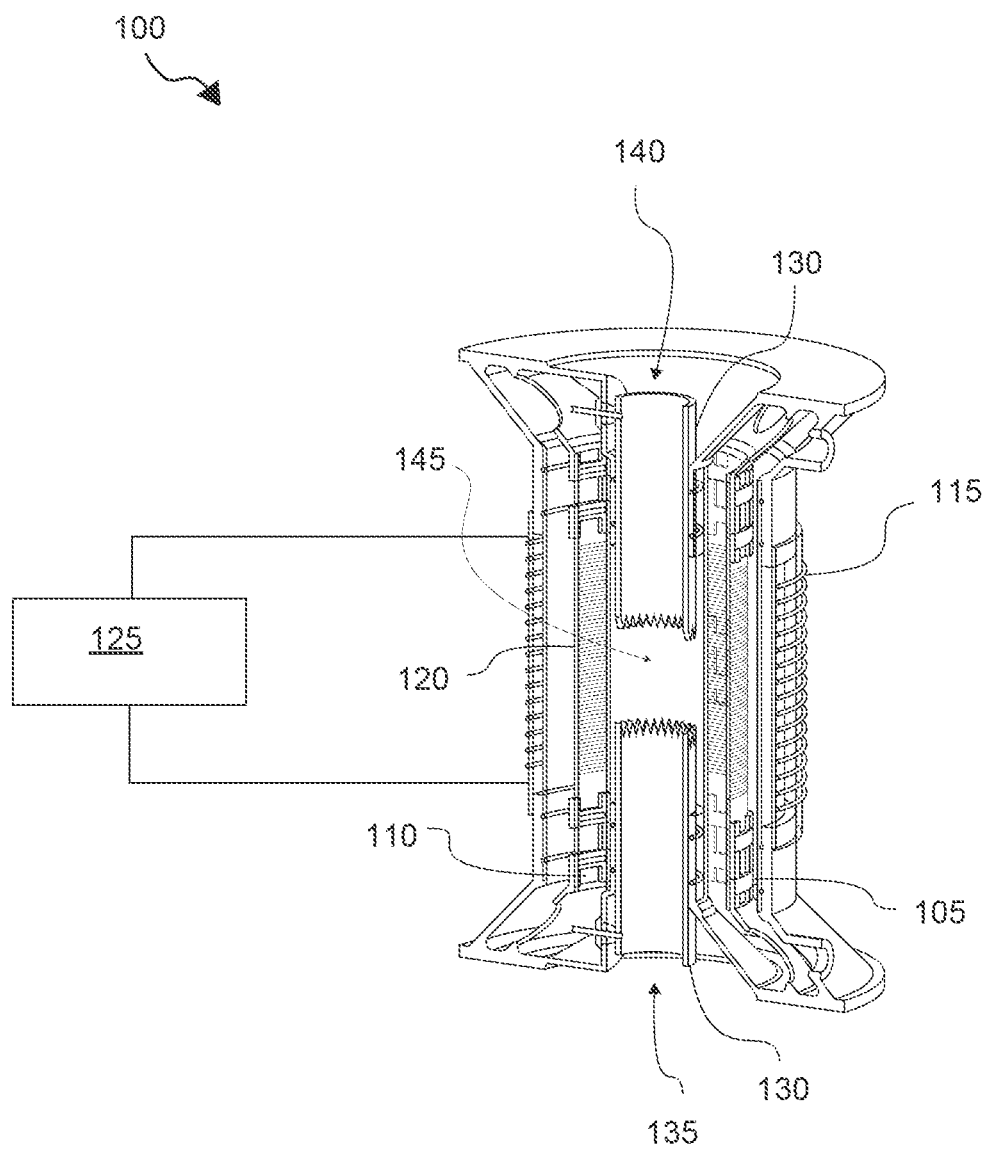
FIG. 1A illustrates an exemplary induction feed through system of some embodiments.

The following description includes information that may be useful in understanding the present invention. It is not an admission that any of the information provided herein is prior art or relevant to the presently claimed invention, or that any publication specifically or implicitly referenced is prior art.

The inventive subject matter provides apparatus, systems, and methods to deliver high-voltage power to a plasma generating device via induction feed through. For example, a step-up transformer, high dielectric strength material(s), electrostatic or electromagnetic pick up(s), fluid flow form(s), and electrical load(s) are used by the inventive subject matter. In some embodiments a low turn primary coil is wrapped around an insulating material and connected to a high voltage power supply. A secondary high turn coil can be disposed in the medium being excited (solid, liquid, gas, plasma and/or mixture) and directly connected to the electrode assembly, or encapsulated in a closed container containing a high dielectric strength insulating substance (such as glass, quartz, transformer oil, insulated magnetic particles, ferroelectric particles, and/or tar) and connected to an electrode assembly by a short conductive feed through, for example protruding into the medium being excited from the insulating container. The plasma created by the electrode assembly (non-thermal or thermal) is surrounded by the primary and secondary coils preferably such that the electromagnetic fields and electrostatic fields generated from the plasma induce a broad spectrum of frequencies onto the primary and secondary coil, which in turn forms a direct feedback to the plasma electrode assembly regardless of electrical filtering and/or extra circuitry.

Such an induction feed through system can be applied in many ways. For example, it can be applied in treating complex materials (e.g., fuel streams, air streams, exhaust streams, combined streams, hydrocarbon streams, etc, in liquid, solid, gas, or plasma phase, or combination thereof) using low complexity equipment, for example reforming a hydrocarbon, natural gas, or methane flow into carbons and hydrogen with such hydrogen preferably stored or used in a fuel cell. Certain fast chemical processes require a complicated feedback process. Favorably, the induction feed through system of the inventive subject matter changes its influencing fields quicker using direct feedback than is attained with complicated feedback processes known in the art. The inventive subject matter can also be applied to energy transmission systems to quench corona loss or voltage breakdown of a transformer, transmission line, or feed through. Viewed from another perspective, the transformer, transmission line, and feed through are integrated into a single device by the inventive subject matter, providing reduced complexity, increased power efficiency, and improved feedback response.

In some embodiments, the induction system can be used to decouple or insulate an electrode in a reaction zone from a power source. This is particularly useful and effective in preventing electrical feedback or interference at the electrode from damaging the power source or other portions of the system. For example, such decoupling is effective at preventing microwave energy or other radio frequency energy directed at or near an electrode from damaging the power source or other portions of the system.

The inventive subject matter can also be applied to energy production. The direct feedback feature of the induction feed through system self-regulates kinetic and potential energy of the plasma, optimizing the power factor between the power supply, device, and load. Coefficient of performance is increased through coupling closed electric, magnetic, and photonic fields with the near and far field open electric, magnetic, and photonic fields.

It can also be applied to propulsion, for example spacecraft propulsion. The induction feed through system enables increased hydrodynamic control of a medium through direct electro-hydro-dynamic (EHD) and magneto-hydro-dynamic (MHD) feedback. Micro pressure differentials between particle-particle interactions are cohered into larger ion acoustic displacements, generating compressed and rarified waves in the plasma which are used to accelerate the high energy and neutral particles influence by the induction feed through system.

In some embodiments, an electrode assembly is disposed within the inner chamber of a reaction chamber. The electrode assembly is connected to a low-turn coil, and a first electrode on a high-turn coil is further connected to ground. A second electrode on the high-turn coil is isolated from ground. In some embodiments the first electrode and the second electrode are not the same. The assembly can include a third electrode connected to the low-turn coil, typically located upstream of the first or second electrode. In preferred embodiments the low-turn coil is disposed about an outer wall of the reaction chamber, and the high-turn coil is disposed about an outer wall of the inner chamber. In some embodiments, the high-turn coil is disposed about an interior wall of the inner chamber.

The inventive subject matter further contemplates methods, systems, and devices for a plasma generator reforming a feedstock (e.g., hydrocarbon, low C (<5) hydrocarbon, natural gas, methane, etc.) into a product (e.g., hydrogen, carbon, hydrocarbons with lower C than the feedstock, etc.). A first reaction zone receives the feedstock and comprising a first electrode, wherein the first electrode is configured to generate a plasma (e.g., DBD plasma, arc plasma, glide arc plasma, etc.) in the first reaction zone by magnetic induction (e.g., electrode energized via paired inductive coils). A first microwave waveguide (or emitter) is directed at a second reaction zone downstream of the first reaction zone. Preferably the first microwave waveguide energizes the plasma and propagates it (enables it to propagate, spread, extend, etc.) to the second reaction zone.

Some embodiments include an induction coil about a third reaction zone downstream of the second reaction zone. The induction coil energizes the plasma and propagates it from the second reaction zone to the third reaction zone, and the induction coil is insulated from the third reaction zone.

A second microwave waveguide is optionally directed at a third reaction zone downstream of the second reaction zone, such that the second microwave waveguide energizes the plasma and propagates it to the third reaction zone. In such cases, an induction coil is further disposed about a fourth reaction zone downstream of the third reaction zone. The induction coil energizes the plasma and propagates it from the third reaction zone to the fourth reaction zone. Preferably, the induction coil is insulated from the fourth reaction zone.

Embodiments further include a pair of coils radially surrounding the first reaction zone and configured to cause the magnetic induction therein, for example to energize the first electrode. The pair of coils typically include a low-turn coil radially outside the first reaction zone and a high-turn coil radially surrounded by the low-turn coil, with the high-turn coil electrically coupled to the first electrode. The high-turn coil generally has a higher turn count than the low-turn coil. The low-turn coil is electrically insulated from the first electrode, and is electrically coupled to a high-voltage power supply. The high-turn coil is disposed outside the reaction zone. The low-turn coil and the high-turn coil are generally coaxial and partially extend along a common axis, overlapping in part.

A second electrode can be further disposed in the first reaction zone and energized by the high-turn coil, such that the first and second electrodes generate the plasma. The first electrode and second electrode are typically nested and extend along a common axis, overlapping in part.

Further systems, methods, and devices for a plasma generator reforming a feedstock into a product are contemplated. A first microwave waveguide is directed at a plasma in a first reaction zone receiving the feedstock. An induction coil is disposed about a second reaction zone downstream of the first reaction zone. The microwave waveguide energizes the plasma in the first reaction zone and the induction coil at least partially energizes the plasma and propagates it (e.g., extends, spreads, enables, etc.) to the second reaction zone. The induction coil is insulated from the second reaction zone. Preferably, no electrode is in direct communication with the feedstock or plasma in the second reaction zone.

In some embodiments a second microwave waveguide is directed at the plasma in a reaction zone upstream of the first reaction zone. The second microwave waveguide energizes the plasma and propagates it from the upstream reaction zone to the first reaction zone. Alternatively or in combination, a second (or additional) microwave waveguide is directed at the plasma in a reaction zone between the first reaction zone and the second reaction zone, such that the second microwave waveguide energizes the plasma and propagates it from the first reaction zone to the second reaction zone. Moreover, a second (or additional) microwave waveguide can be directed at the plasma in a reaction zone downstream of the second reaction zone, either additionally or as an alternative.

An electrode can further be disposed in communication with the feedstock, for example upstream of the first reaction zone. A pair of coils can also be disposed upstream of the first reaction zone, configured to cause magnetic induction (e.g., to energize the electrode, to generate an inductive plasma, etc.). The pair of coils typically include a low-turn coil and a high-turn coil, where the high-turn coil is radially surrounded by the low-turn coil and electrically coupled to the electrode, wherein the high-turn coil has a higher turn count than the low-turn coil. Preferably, the low-turn coil is electrically insulated from the electrode and coupled to a high-voltage power supply.

In some embodiments, the electrode is the first electrode of two or more electrodes, for example where a second electrode is in communication with the feedstock upstream of the first reaction zone and energized by the high-turn coil, such that the first and second electrodes generate the plasma. In such cases, the first electrode and second electrode are nested and extend along a common axis, at least partially overlapping.

Further systems, methods, and devices for a plasma generator are contemplated. An inlet is configured to couple with a source of a feedstock stream, which includes a hydrocarbon gas. A reaction zone with a first electrode is disposed downstream of the inlet and encloses a volume for passthrough of the feedstock. A power supply provides power to the first electrode. An outlet is disposed downstream of the reaction zone to output a reacted species, which includes hydrogen or carbon, or both, for further processing. A microwave emitter is directed at the reaction zone between the first electrode and the outlet.

In some embodiments the reaction zone includes a first segment receiving the feedstock stream from the inlet. A plasma in the first segment reacts with the feedstock stream to produce the reacted species. The first segment is typically configured to convey the reacted species to a second segment of the reaction zone, while the energy emitted by the microwave emitter is directed to the second segment. The reaction zone can include an additional segment disposed between the second segment and the outlet. Likewise, a low-turn coil can be disposed along one of the segments of the reaction zone, with a high-turn coil (at least partially) within the low-turn coil. The high-turn coil typically has a higher turn count than the low-turn coil. In some embodiments the high-turn coil is disposed along the first segment upstream of the second segment, and can be disposed within the volume of the reaction zone, either alternatively or in combination.

A power source can be further included, such that the power source, the low-turn coil, and the high-turn coil are configured to generate a magnetic field having a strength between 1,000 gauss and 100,000 gauss.

The microwave emitter can be one of several emitters, such as a first microwave emitter, when a second or more microwave emitters are included. The second microwave emitter can be arranged in series or in parallel with the first microwave emitter, and can be disposed downstream (or upstream) of the first microwave emitter.

A filtering structure can further be disposed to interact with the reacted species, for example one of a porous substrate, a permeable layer, a semi-permeable layer, a selectively permeable layer, or a gradient, or combinations thereof. Likewise a directing structure can be disposed to interact with the reacted species, for example a rotor, a capillary, or a cavity, or combinations thereof.

FIG. 1A illustrates an example of an induction feed through system 100. The induction feed through system 100 includes an outer chamber 105 and an inner chamber 110. As shown, the inner chamber 110 is at least partially disposed within the outer chamber 105. Preferably, the entire inner chamber 110 is disposed within the outer chamber 105. In some embodiments, the outer chamber 105 is made of mostly of insulating materials such as glass, quartz, etc. In some embodiments, the inner chamber 110 is also made of mostly of insulating materials such as glass, quartz, etc.

The induction feed through system 100 also includes a primary coil 115 and a secondary coil 120. Both of the primary coil 115 and secondary coil 120 comprises a majority of highly electric conductive materials. Examples of coils that can be used as the primary coil 115 and the secondary coil 120 include copper wire, lithographically deposited conductor, a tube with conductive medium, etc. In some embodiments, the primary coil 115 is wrapped around the exterior wall of the outer chamber 105. The primary coil 115 is also connected to a high-voltage power supply 125. In some embodiments, the secondary coil 120 is wrapped around the exterior wall of the inner chamber 110. As shown, the secondary coil 120 has a higher turn count than the primary coil 115, such that when placed near each other, the primary coil 115 and secondary coil 120 work together to form a step-up transformer.

Preferably the secondary coil 120 has substantially more turn count (e.g., twice, three times, four times as many, etc.) than the primary coil 115. The primary coil 115 and the secondary coil 120 are not physically connected with each other. In some embodiments, the secondary coil 120 is encapsulated in a closed container containing a high dielectric strength insulating substance (such as glass, quartz, transformer oil, insulated magnetic particles, ferroelectric particles, and/or tar), where the closed container is disposed around the exterior wall of the inner chamber 110.

Preferably, the power supply 125 provides a voltage within a range of 500 Volts (V) to 50,000V to the primary coil 115. Through the step-up transforming aspect of the primary coil 115 and secondary coil 120, the secondary coil 120 will be induced to carry a higher voltage within a range of 500V to 1 mega-Volts. With this power input and output, the coil configuration can generate a magnetic field having a strength between 1,000 gauss and 100,000 gauss. One of the advantages is that this system can provide a very high voltage to the electrode without transmitting such a high voltage through the power line to avoid power leakage.

In some embodiments, the induction feed through system 100 also includes an electrode assembly 130. The electrode assembly 130 is preferably disposed within the inner chamber 110. The electrode assembly 130 is connected with the secondary coil 120 such that the secondary coil 120 can be used to power the electrode assembly 130. In some of these embodiments, the induction feed through system 100 includes a short conductive feedthrough that passes through the closed encapsulation to connect the secondary coil 120 directly to the electrode assembly 130. The electrode assembly 130 includes at least one electrode configured to emit electromagnetic energy within the inner chamber 110.

While the embodiment of FIG. 1A depicts electrode assembly 130 disposed within inner chamber 110, it should be appreciated no electrodes can be disposed within chamber 110. In such applications, primary and secondary coils 115 and 120 are used to energize or propagate a plasma in excitation zone 135, for example a plasma from upstream of the excitation zone (e.g., glide-arc plasma, microwave plasma, etc.). In such embodiments, the induction between primary and secondary coils 115 and 120, extends, or modifies, or is otherwise able to provide feedback to such plasma while favorably avoiding the buildup or deposit of contaminants or by-products from streams in the excitation zone.

The inner chamber 110 also includes an inlet 135 and an outlet 140, such that substances to be excited by the electromagnetic energy produced by the electrode assembly 130 can pass through the excitation zone 145 of the inner chamber 110. Substances that can pass through the excitation zone 145 can include solid, liquid, gas, plasma, or mixture of any of these substances (e.g., air, water/water vapor, industrial fluids, and internal combustion engine exhaust gases). In some embodiments excitation zone 145 is empty (except for the substance to be excited), but the excitation zone can further include fill material for retaining, channeling, filtering, or directing the substance or portions thereof (e.g., porous substrate, permeable layer, semi-permeable layer, selectively permeable layer, rotor, capillaries, cavities, etc).

The substance may pass through the inner chamber 110 of the induction feed through system 100 according to the direction indicated by the arrows. The housing of the outer chamber 105 and the inner chamber 110 insulate the primary coil 115 from the secondary coil 120, and also insulate both coils from the excitation zone 145. Under this configuration, the induction feed through system 100 discharges plasma (either thermal or non-thermal) within the excitation zone 145 to excite substances that pass through excitation zone 145. The electromagnetic and electrostatic fields generated from the plasma and the excited substance may induce a broad spectrum of frequencies (oscillations) back onto the primary coil 115 and secondary coil 120 as a feedback.

The feedback on the primary coil 115 and secondary coil 120 can be detected as electrical drive waveforms, which can be used to (1) ascertain the type of substance being excited inside the excitation zone 145, (2) ascertain the energy density of the plasma generated by the electrode assembly 130, (3) increase the coefficient of plasma generation performance, (4) increase the chemical selectivity of the plasma process, and (5) modulate the power in sending and receiving information via plasma antenna. The inventive subject matter allows this detection without the use of any additional circuitry or complex feedback system.

In some embodiments, the induction feed through system 100 can also include a magneto-hydrodynamic cell (not shown) configured to harvest energy from the movement of charged particles flowing within the excitation zone 145. In some embodiments, the magneto-hydrodynamic cell is disposed inside the excitation zone 145 or downstream of the excitation zone 145. The magneto-hydrodynamic cell of some embodiments can be made up of two electrodes, which are disposed in the charged medium. The electrodes can be the powered electrode assembly as well as another electrode assembly disposed in the same excitation zone 145. The charged particles moving through the excitation zone 145 may induce a voltage onto the secondary coil 120 and the primary coil 115. The magneto-hydrodynamic cell of some embodiments has complementary magnetic, electric, acoustic, thermionic, and/or photonic members which converts the movement of charged particles in the plasma directly into electrical power, as well as focuses the electromagnetic, electrostatic, acoustic, thermionic, and photonic emissions of the plasma in such a way as to establish and/or regulate instabilities in the plasma.

In some instances, electromagnetic radiation that is emitted from the excited substance in the excitation zone 145 is redirected back onto the excited substance and or absorbed by the assembly. The electrode assembly 130, the insulating materials used in the outer chamber 110, and the electromagnetic coils 115 and 120 will inherently reflect some portion of the electromagnetic spectrum radiated from the plasma back onto the plasma. This electromagnetic radiation emanated and reflected back onto the plasma assists in the ionization of the medium by lowering the work function of the electrodes though ultraviolet light reflecting onto the electrode assembly, and the photons reflected back onto the plasma informs the plasma about other photo-ionization processes occurring in selective regions of the plasma as well as un-ionized gases pre and post plasma.

In some embodiments, the induction feed through system 100 also includes capacitive/electrostatic inductive coupling. Conductive plates housed inside and outside the insulating housing of the outer chamber 105 and inner chamber 110 to deliver high voltage DC to the electrodes as well as be a direct capacitive feedback on the plasma. In some embodiments, the induction feed through system 100 includes two inner conductive plates, where each is connected to an electrode terminal.

In some embodiments, the induction feed through system 100 also includes inductive coupling. The inductive coupling can be implemented as feedback electromagnetic coils disposed near to or within the ionized medium (within the excitation zone 145) for measuring, influencing, or directly providing feedback to the secondary coil 120 and/or the primary coil 115.

In some embodiments, the induction feed through system 100 also includes negative resistance coupling. A dielectric container that contains an ionizable medium (e.g., gas, liquid, solid, plasma, or mixture thereof), which can be used to measure, influence, or provide direct feedback to the secondary coil 120 and/or the primary coil 115.

In some embodiments, the induction feed through system 100 also includes a magneto-hydrodynamic/electro-hydrodynamic coupling. Electrodes disposed in the plasma stream are surrounded by magnetic fields generated from the primary coil 115 and the secondary coil 120, DC permanent magnetic or other external magnetic fields sources. The magneto-hydrodynamic/electro-hydrodynamic coupling can be used as a feedback mechanism for the primary coil 115 and/or the secondary coil 120, or used to generate electrical power directly from the charge separation of the movement of charged particles.

In some embodiments, the inductive feed through system 100 also provides photonic feedback by having the electrode assembly, insulating chamber, and the electromagnetic coils reflect some portion of the radiated electromagnetic spectrum emitted from the plasma back onto the plasma. The inductive feed through system 100 can also include semiconductive sensors, which can measure the chemical optical emissions from the plasma for determining chemical reactions, electrical feedback, and heat signatures.

Figure 1B:
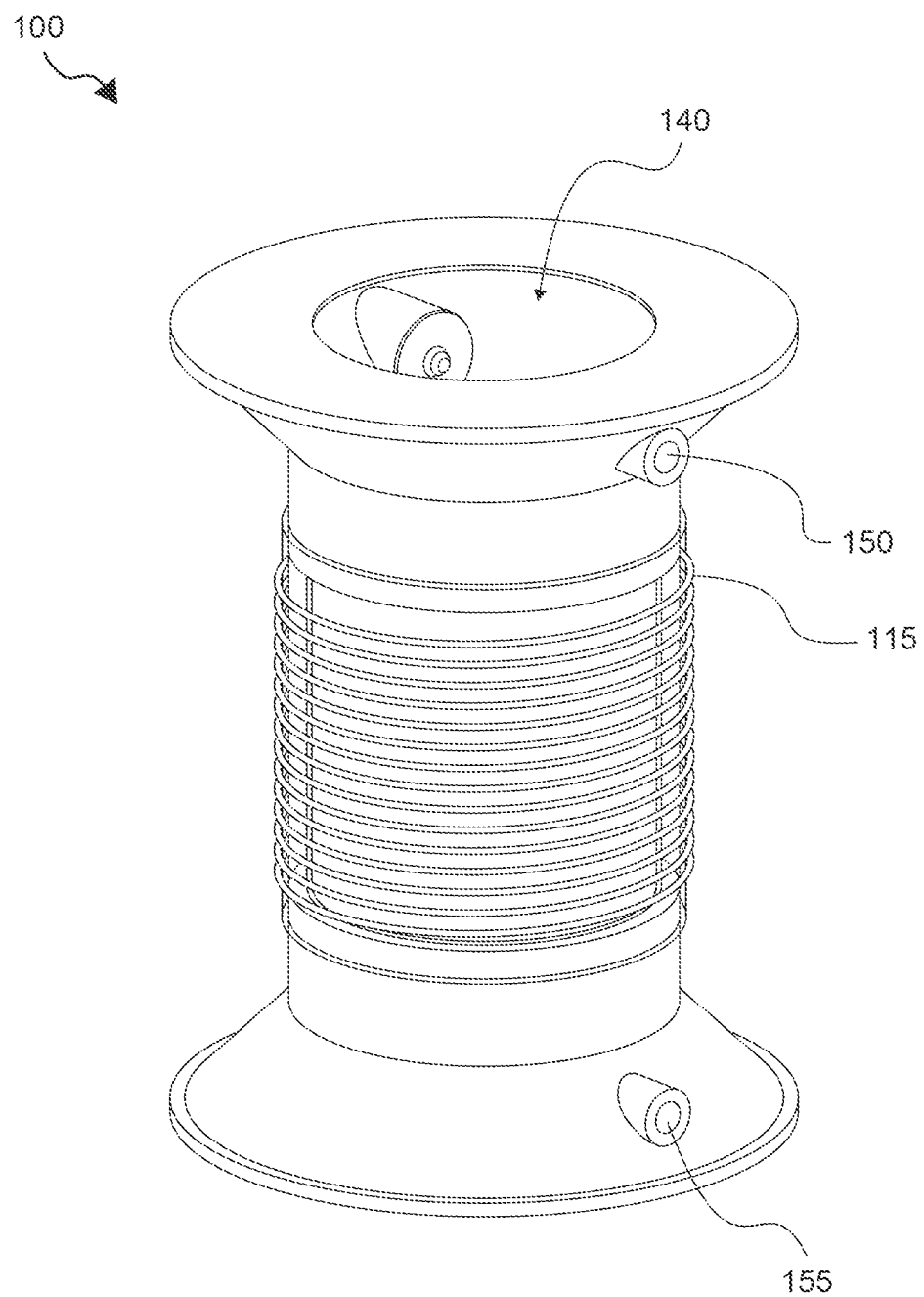
FIG. 1B illustrates a top, perspective view of the induction feed through system of some embodiments.

FIG. 1B illustrates a top, perspective view of the induction feed through system 100. Primary coil 115 is clearly visible wrapped around the external wall of the outer chamber. Dielectric medium ports 150 and 155 are also more clearly visualized. While various dielectric mediums (and phases) are fit for use in the inventive subject matter, in preferred embodiments the dielectric medium is a liquid dielectric. Dielectric medium ports 150 and 155 permit dielectric medium to fill outer chamber 105 with liquid dielectric.

Figure 1C:
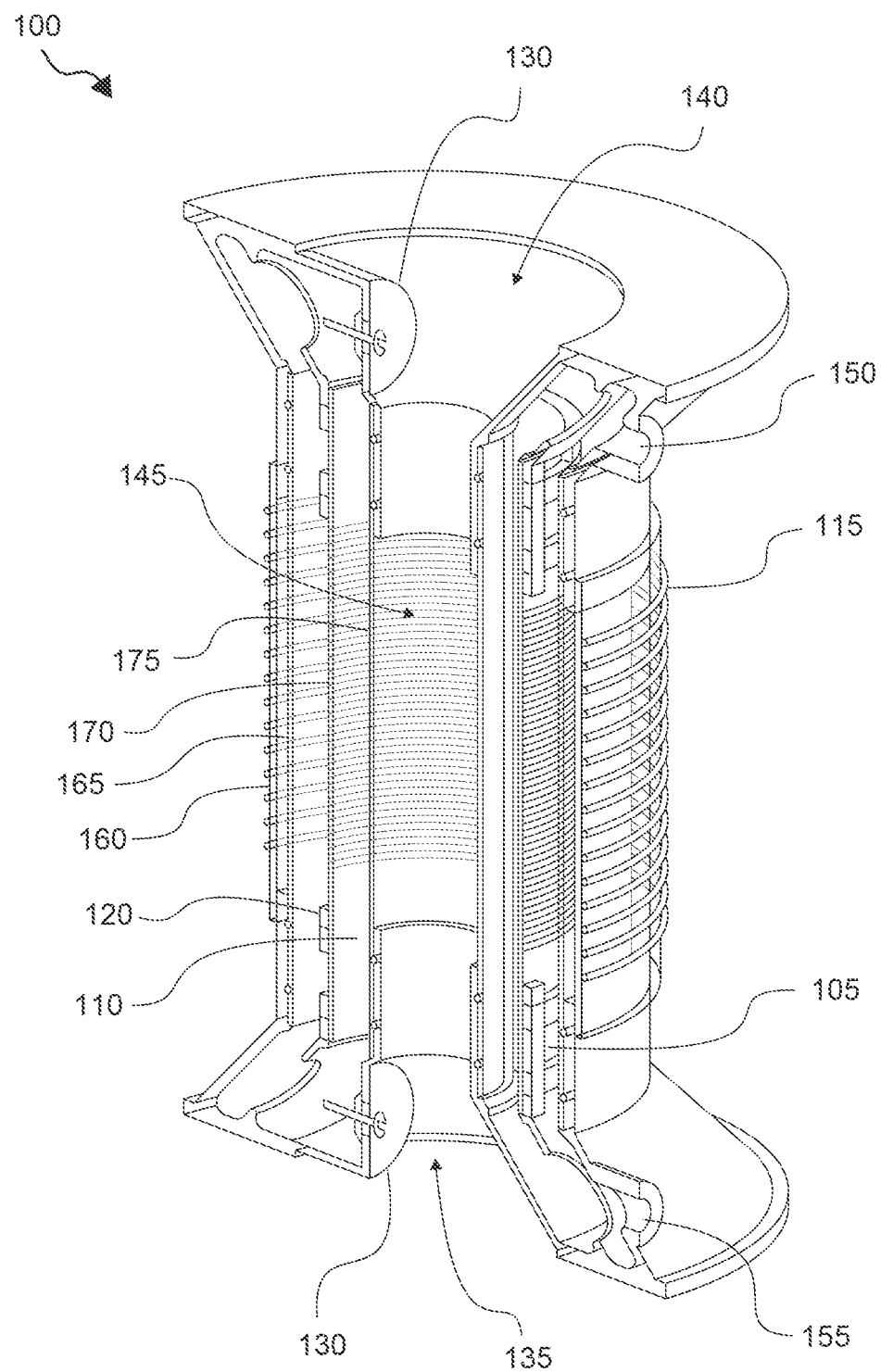
FIG. 1C illustrates another top, perspective, cutaway view of the induction feed through system of some embodiments.

FIG. 1C illustrates another top, perspective, cutaway view of the induction feed through system 100. In this view, insulating layers 160, 165, 170, and 175 are more clearly depicted. In this embodiment, primary coil 115 wraps around insulating layer 160, while insulating layer 165 makes up part of the wall that defines outer chamber 105. Insulating layer 170 makes up another wall of outer chamber 105, around which secondary coil 120 is wrapped. Insulating layer 175 makes up part of the wall that defines excitation zone 145.

Figure 1D:
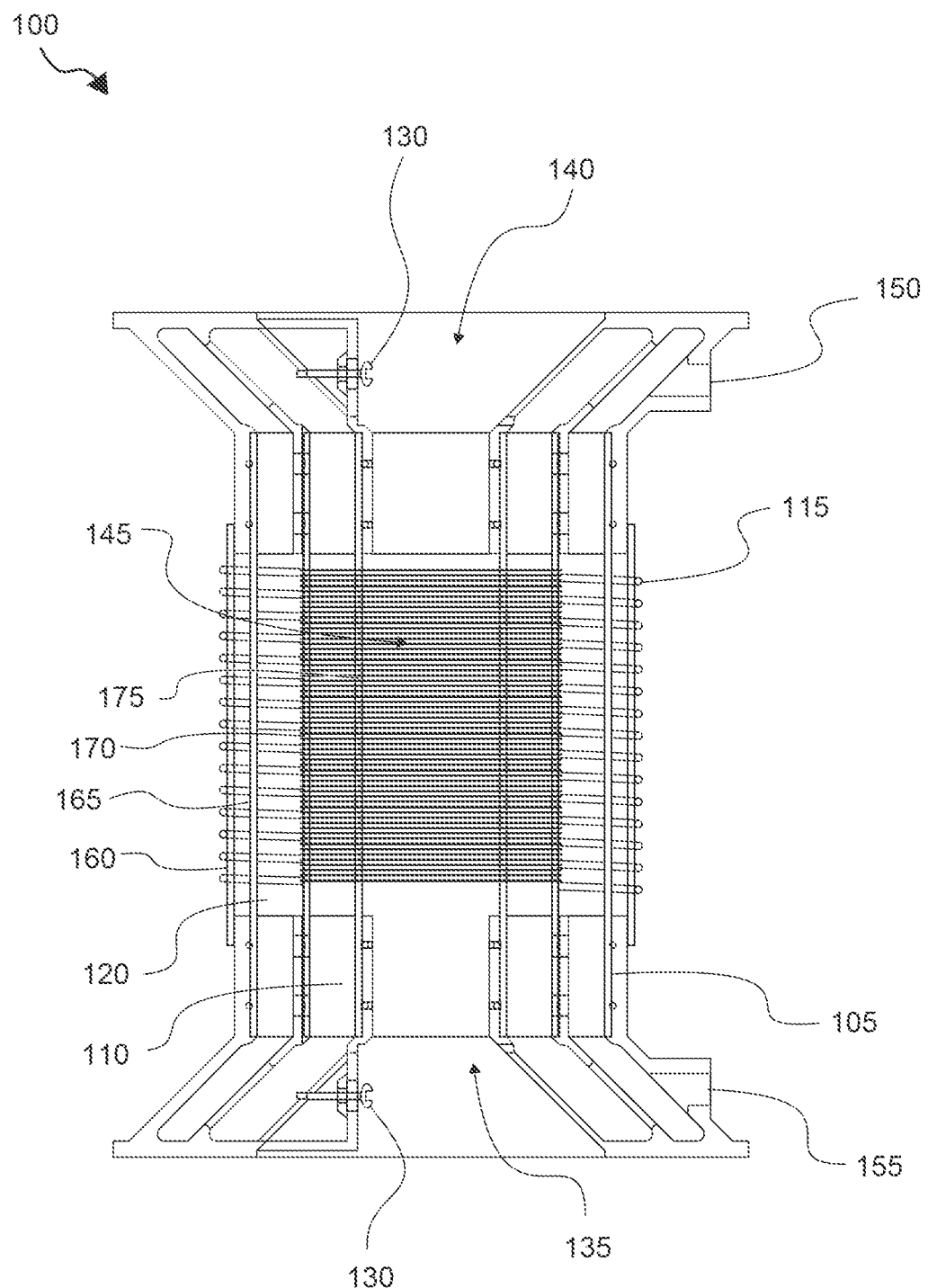
FIG. 1D illustrates a side, cutaway view of the induction feed through system of some embodiments.

FIG. 1D illustrates a side, cutaway view of the induction feed through system 100.

FIGS. 1A-1D illustrate one embodiment of the inventive subject matter in which the secondary coil wraps around the exterior wall of the inner chamber of the induction feed through system. In some embodiments however, the secondary coil can be disposed within the inner chamber such that when a substance passes through the excitation zone, the substance is surrounding the secondary coil.

Figure 2A:
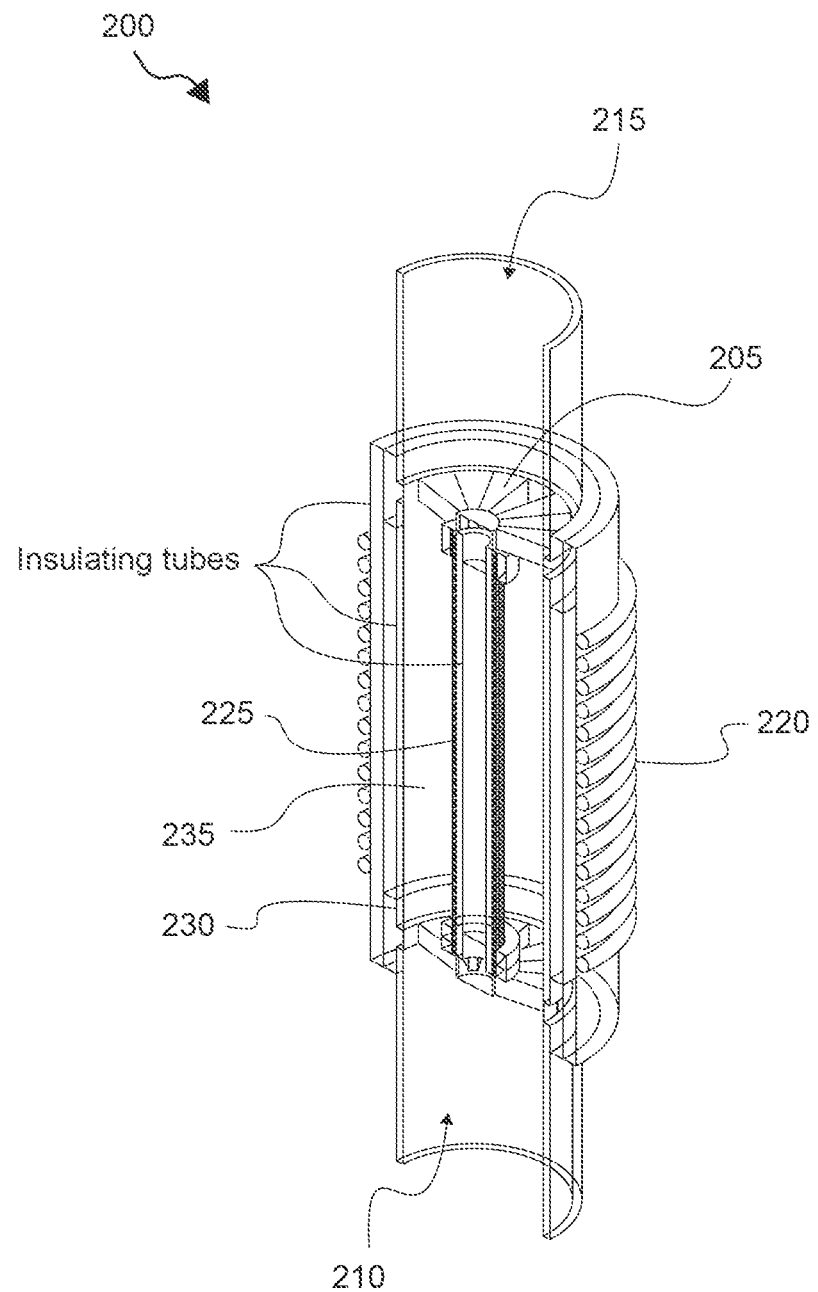
FIG. 2A illustrates an alternative induction feed through system of some embodiments.

FIG. 2A illustrates an example of such an induction feed through system 200. The induction feed through system 200 includes a chamber 205 having an inlet 210 configured to allow substance to enter into the chamber 205 and an outlet 215 configured to allow the substance to exit the chamber 205. The induction feed through system 200 also includes a primary coil 220 and a secondary coil 225. The primary coil 220 is disposed on an exterior wall of the chamber 205 while the secondary coil 225 is disposed within the chamber 205.

Similar to the induction feed through system 100, the secondary coil 225 preferably has substantially more turn count (e.g., twice, three times, four times as many, etc.) than the primary coil 220. The primary coil 220 and the secondary coil 225 are not physically connected with each other. In some embodiments, the secondary coil 225 is encapsulated in a closed container containing a high dielectric strength insulating substance (such as glass, quartz, transformer oil, insulated magnetic particles, ferroelectric particles, and/or tar), where the closed container is disposed within the chamber 205.

In some embodiments, the induction feed through system 200 optionally includes an electrode assembly. The electrode assembly includes at least one electrode configured to emit electromagnetic energy within an excitation zone 235 of the chamber 205. The electrode assembly is preferably disposed within the chamber 205. Unlike the induction feed through system 100, the secondary coil 225 of the induction feed through system 200 is disposed within the electrode assembly 230 and is optionally directly connected with the electrode assembly.

Figure 2B:
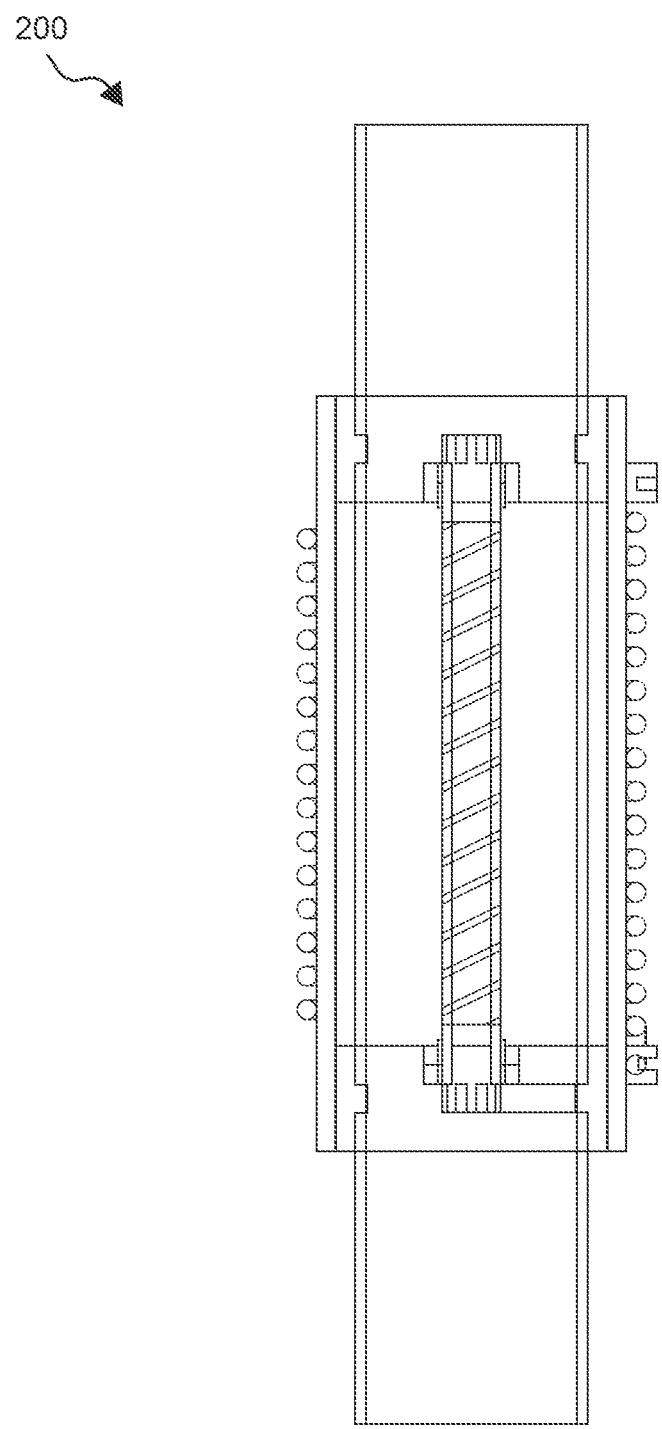
FIG. 2B illustrates a side cutaway view of the alternative induction feed through system of some embodiments.

FIG. 2B illustrates a side cutaway view of the induction feed through system 200.

Figure 2C:
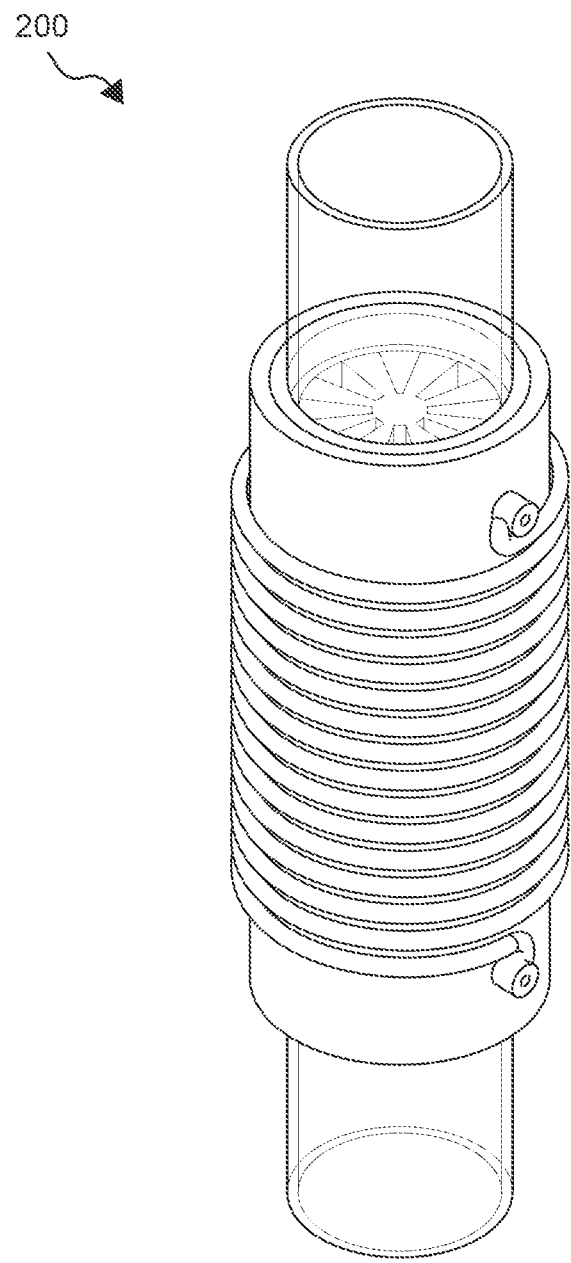
FIG. 2C illustrates a top, perspective view of the alternative induction feed through system of some embodiments.

FIG. 2C illustrates a top, perspective view of the induction feed through system 200.

Figure 3A:
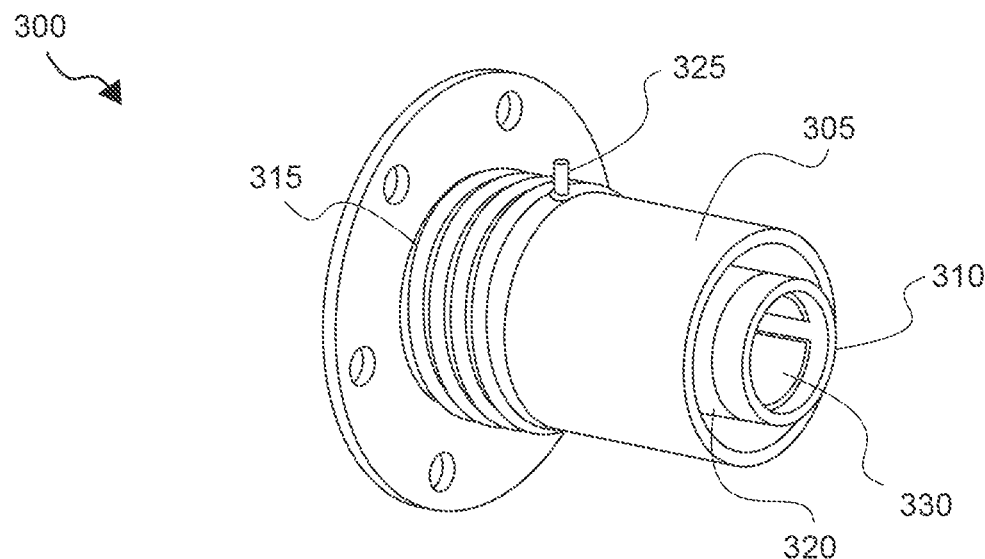
FIG. 3A illustrates another induction feed through system.

FIG. 3A depicts a side profile view of a spacecraft thruster 300. Spacecraft thruster 300 uses induction feed through systems of the inventive subject matter to propel spacecraft. Thruster 300 includes outer wall 305 and inner wall 310, each preferably an insulator. Primary coil 315 is coiled about a portion of outer wall 305, and secondary coil 320 is coiled about a portion of inner wall 310. Primary coil 315 is a low-turn coil and secondary coil 320 is a high-turn coil as previously described. High voltage connector 325 is used to energize primary coil 315 with a high voltage source. Electrode assembly 330 is disposed on an inner surface of inner wall 310.

Figure 3B:
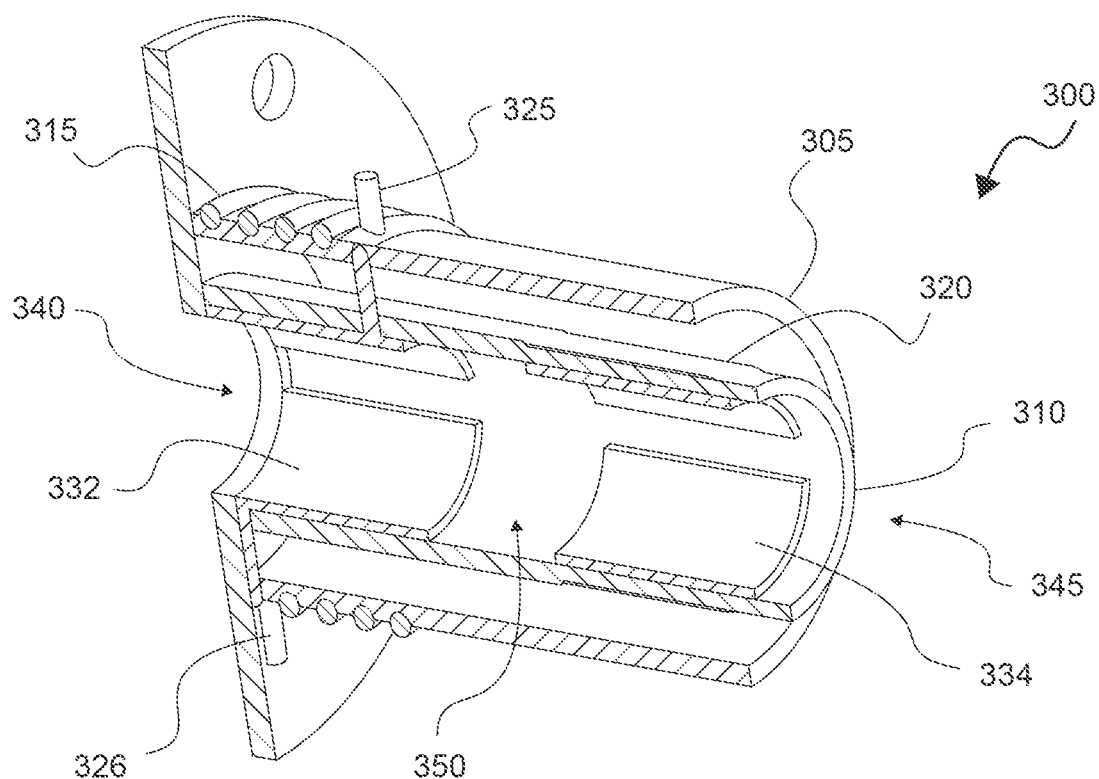
FIG. 3B illustrates a side cutaway view of the feed through system of FIG. 3A.

FIG. 3B depicts a side cutaway view of thruster 300. In this perspective, high voltage connector 36, which energizes primary coil 315, can also be seen. Electrode assembly 330 includes low-turn coil electrodes 332 connected to primary coil 315, and high-turn coil electrodes 334 connected to secondary coil 320. In some embodiments, one of electrodes 334 is grounded. Reaction zone 350 is also depicted within inner wall 310. Inlet 340 and outlet 345 allow propellant (e.g., a gas, a fluid, a mass, etc.) to pass through reaction zone 350 and generate thrust.

Figure 4:
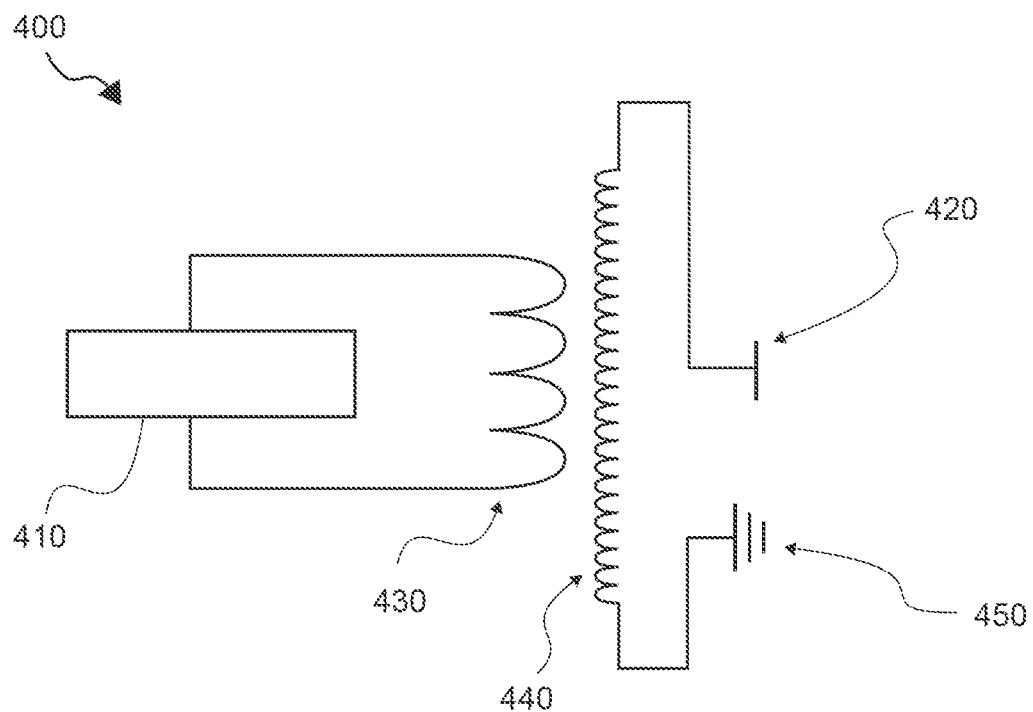
FIG. 4 illustrates an induction system of the inventive subject matter.

FIG. 4 depicts induction system 400 of the inventive subject matter. Critically, power supply 410 is not physically coupled to electrode 420. Rather, the power supply sends electrical current through a set of primary coils 430, which in turn drive current in a set of secondary coils 440 which ultimately energizes electrode 420 to generate a plasma. The secondary set of coils 440 preferably have a higher turn-count than the primary coils 430, enabling the secondary set of coils 440 to drive increased voltage to electrode 420. It should also be noted that the secondary coil and/or the electrode are grounded by ground 450, which drives any electrical feedback or interference to ground rather than passing it to primary coil 430 or power supply 410, preventing damage to system 400.

Figure 5:
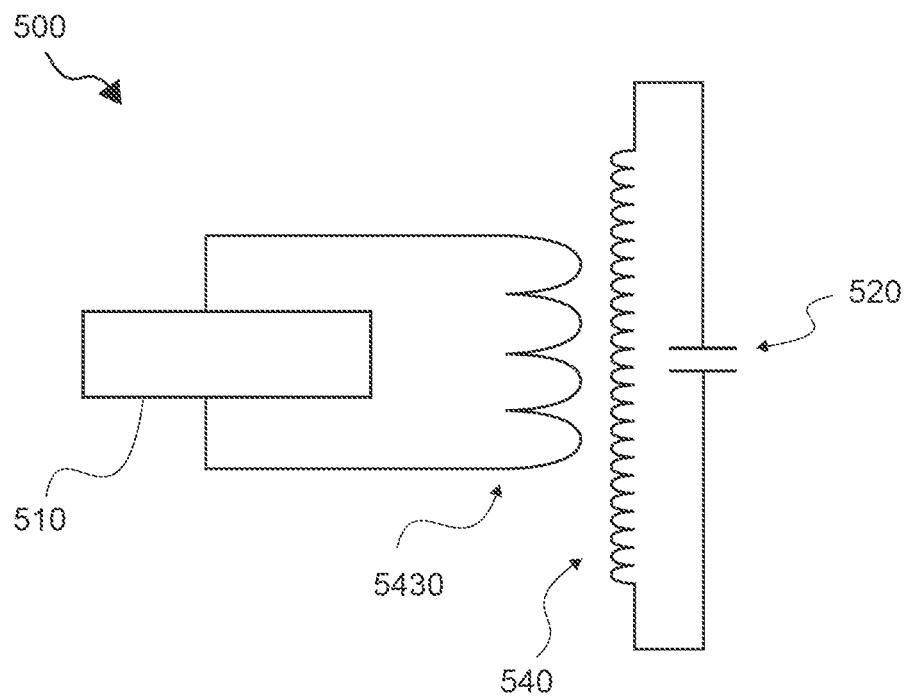
FIG. 5 illustrates another induction system of the inventive subject matter.

FIG. 5 depicts induction system 500, which is similar to FIG. 4. Here, power supply 510 drives current to primary current 530, which likewise induces current in secondary coil 540. The induced current energizes capacitively coupled electrodes 520 electrodes to generate a plasma.

Figure 6:
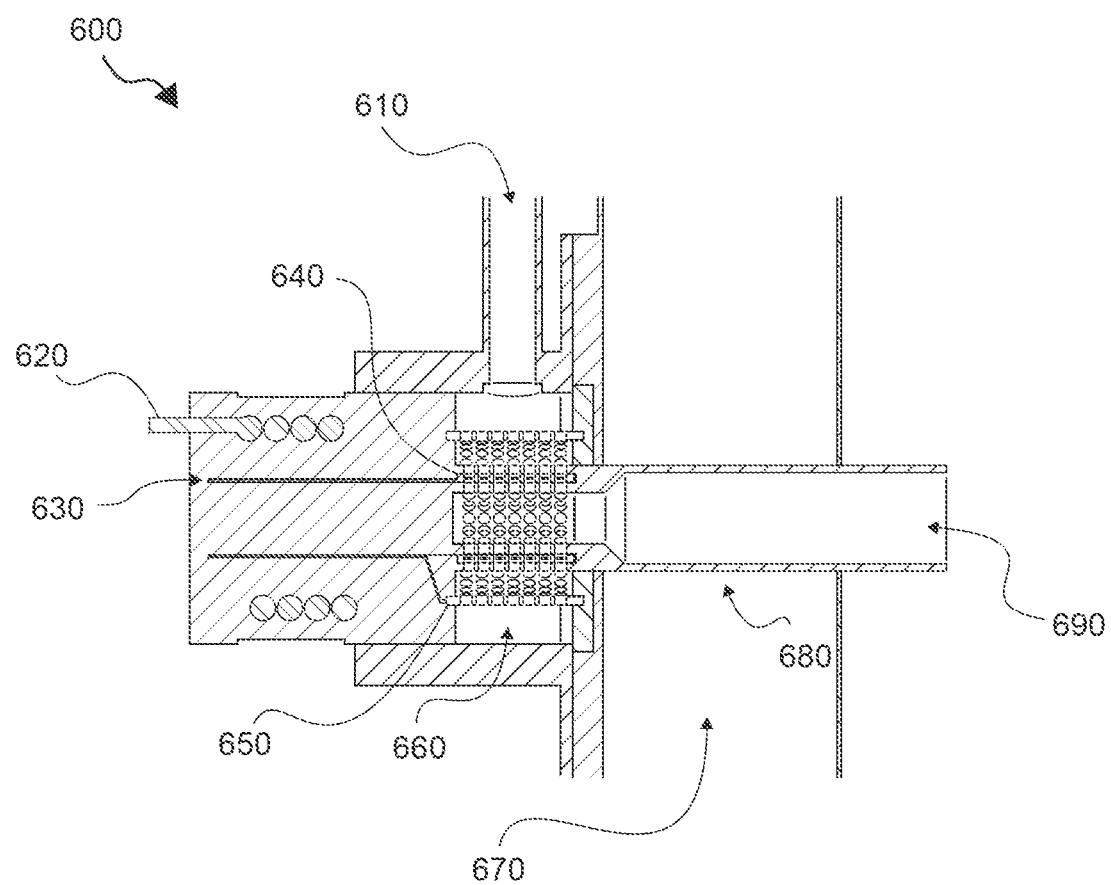
FIG. 6 illustrates a plasma generator of the inventive subject matter.

FIG. 6 depicts plasma generator 600 of the inventive subject matter. A set of low turn coils 620 is energized by a power source (not picture). The low turn coils 620 then impart a current on a set of nested, high turn coils 630 via electromagnetic induction. High turn coils 630 are electrically coupled to outer electrode 650 and inner electrode 640 nested within outer electrode 650. When energized, the two electrodes generate a plasma in zone 660, for example a dielectric barrier discharge plasma, a glide arc plasma, or a rotating glide arc plasma, etc. A feedstock (e.g., less than 12 C hydrocarbon, less than 6 C carbon, less than 4, 3, or 2 C carbon, natural gas, methane, etc.) is supplied to the system at inlet 610 and driven toward outer electrode 650 or inner electrode 640, or toward the plasma generated therefrom in zone 660.

A waveguide, for example microwave guide 670, is directed toward the plasma as it extends to zone 680 and is used to drive microwaves toward the plasma to generate a microwave plasma in zone 680. The plasma and microwave plasma energize the feedstock, reforming the feedstock to its constituent parts, for example carbon and hydrogen, or low C (e.g., less than 6, 5, 4, 3, or 2) hydrocarbons. The reacted species (e.g., constituents of feedstock, carbon, hydrogen, etc.) then pass through outlet 690 where they are further processed, separated, purified, collected, or used (for example, hydrogen used by a fuel cell to generate electricity). As depicted, it is favorable to use dielectric materials for portions of the system that contact coils 620 or 630, or electrodes 640 and 650.

Figure 7:
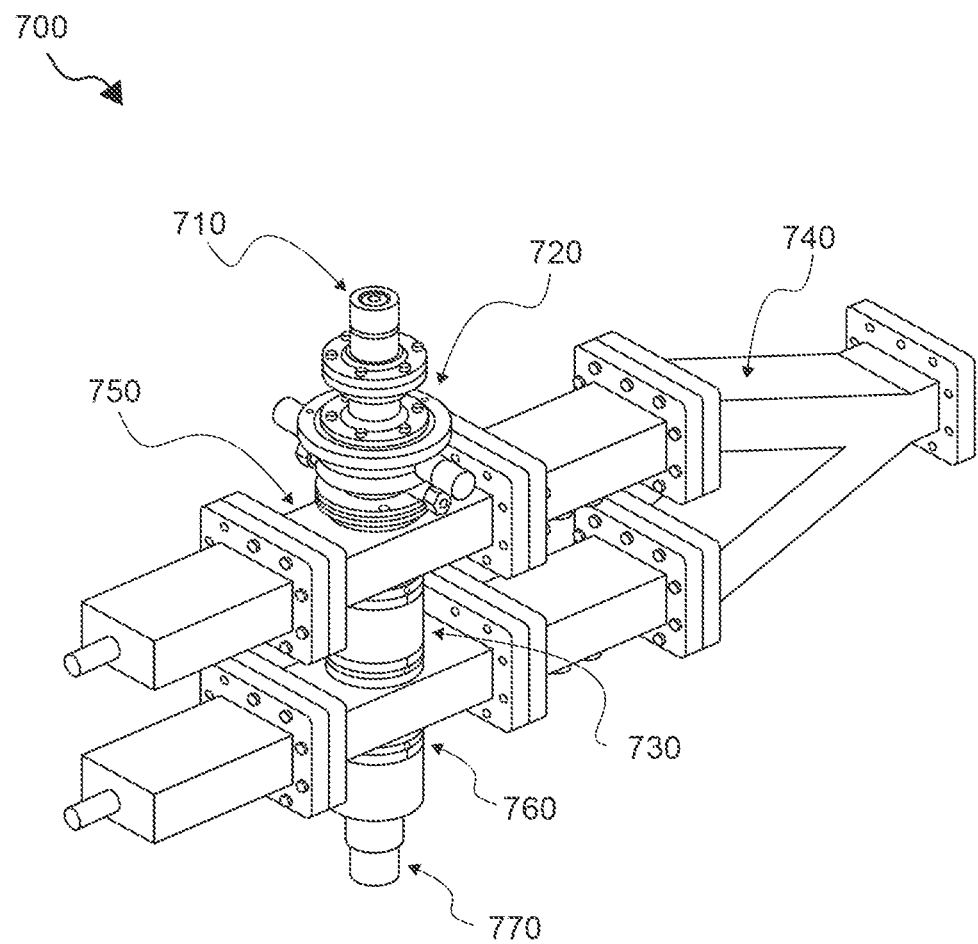
FIG. 7 illustrates waveguides of the inventive subject matter.

FIG. 7 depicts system 700 of the inventive subject matter. Inlet 710 is coupled to a feedstock (e.g., low C hydrocarbon, natural gas, etc.) to deliver feedstock to the system. The feedstock is first treated in treatment and ignition system 720. Treatment and ignition system 720 can include one or more electrodes as disclosed herein for generating one or more plasmas (e.g., DBD plasma, glide arc, etc.). The feedstock and plasma are directed downstream along reactor tube 730, which intersects reaction zones 750 and 770. Waveguide splitter 740 directs a microwave act reaction zone 750 to energize and propagate (e.g., spread, extend, enlarge, etc.) the plasma into and through reaction zone 750. Waveguide splitter 740 further directs a microwave at reaction zone 760 to energize and propagate (e.g., spread, extend, enlarge, etc.) the plasma into and through reaction zone 760.

As feedstock passes through reaction tube 730 (and reaction zones 750 and 760), it is reformed by the plasma along reaction tube 730 (e.g., continuous plasma, separate plasmas in each zone, combinations thereof, etc.) into hydrogen, carbon, or hydrocarbons of lower C than the feedstock. Processed feedstock and reformed products then pass to outlet 770, where they are further directed to (i) additional reaction chambers with plasma extending throughout for reforming the feedstock or products (e.g., further microwave plasmas, induction plasmas, combinations thereof, etc.) or (ii) for separating, sorting, or refining of constituent products (e.g., carbon sorting, hydrogen compression/storage, further reforming of low C hydrocarbons, etc.).

Figure 8:
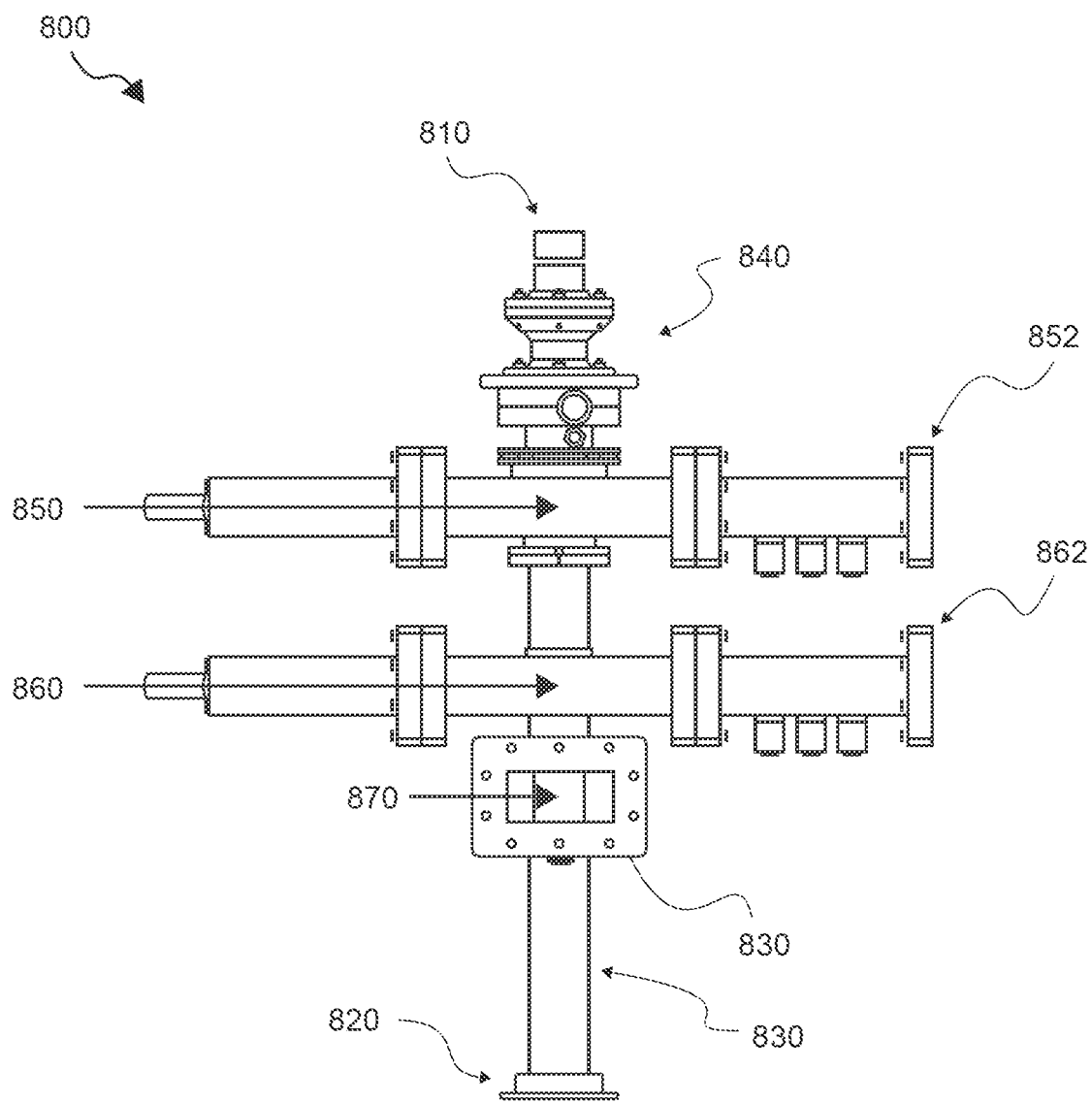
FIG. 8 illustrates further waveguides of the inventive subject matter.

FIG. 8 depicts system 800 of the inventive subject matter, which is similar to system 700 with the addition of a third microwave waveguide directed at plasma and feedstock in the reaction tube. Inlet 810 is coupled to a feedstock (e.g., low C hydrocarbon, natural gas, etc.) to deliver feedstock to the system. Reaction tube 830 extends from inlet 810 to outlet 820, and intersects reaction zones 850, 860, and 870.

The feedstock is first treated in treatment and ignition system 840. Treatment and ignition system 840 can include one or more electrodes as disclosed herein for generating one or more plasmas (e.g., DBD plasma, glide arc, etc.). The feedstock and plasma are directed downstream along reactor tube 830. Waveguide emitter 852 directs a microwave act reaction zone 850 to energize and propagate (e.g., spread, extend, enlarge, etc.) the plasma from 840 into and through reaction zone 850. Waveguide emitter 862 further directs a microwave at reaction zone 860 to energize and propagate (e.g., spread, extend, enlarge, etc.) the plasma into and through reaction zone 860. Waveguide emitter 872 further directs a microwave at reaction zone 870 to energize and propagate (e.g., spread, extend, enlarge, etc.) the plasma into and through reaction zone 870.

As feedstock passes through reaction tube 830 (and reaction zones 850, 860, and 870), it is reformed by the plasma along reaction tube 830 (e.g., continuous plasma, separate plasmas in each zone, combinations thereof, etc.) into hydrogen, carbon, or hydrocarbons of lower C than the feedstock. Processed feedstock and reformed products then pass to outlet 820, where they are further directed to (i) additional reaction chambers with plasma extending throughout (or existing separately in each zone) for reforming the feedstock or products (e.g., further microwave plasmas, induction plasmas, combinations thereof, etc.) or (ii) for separating, sorting, or refining of constituent products (e.g., carbon sorting, hydrogen compression/storage, further reforming of low C hydrocarbons, etc.).

Figure 9:
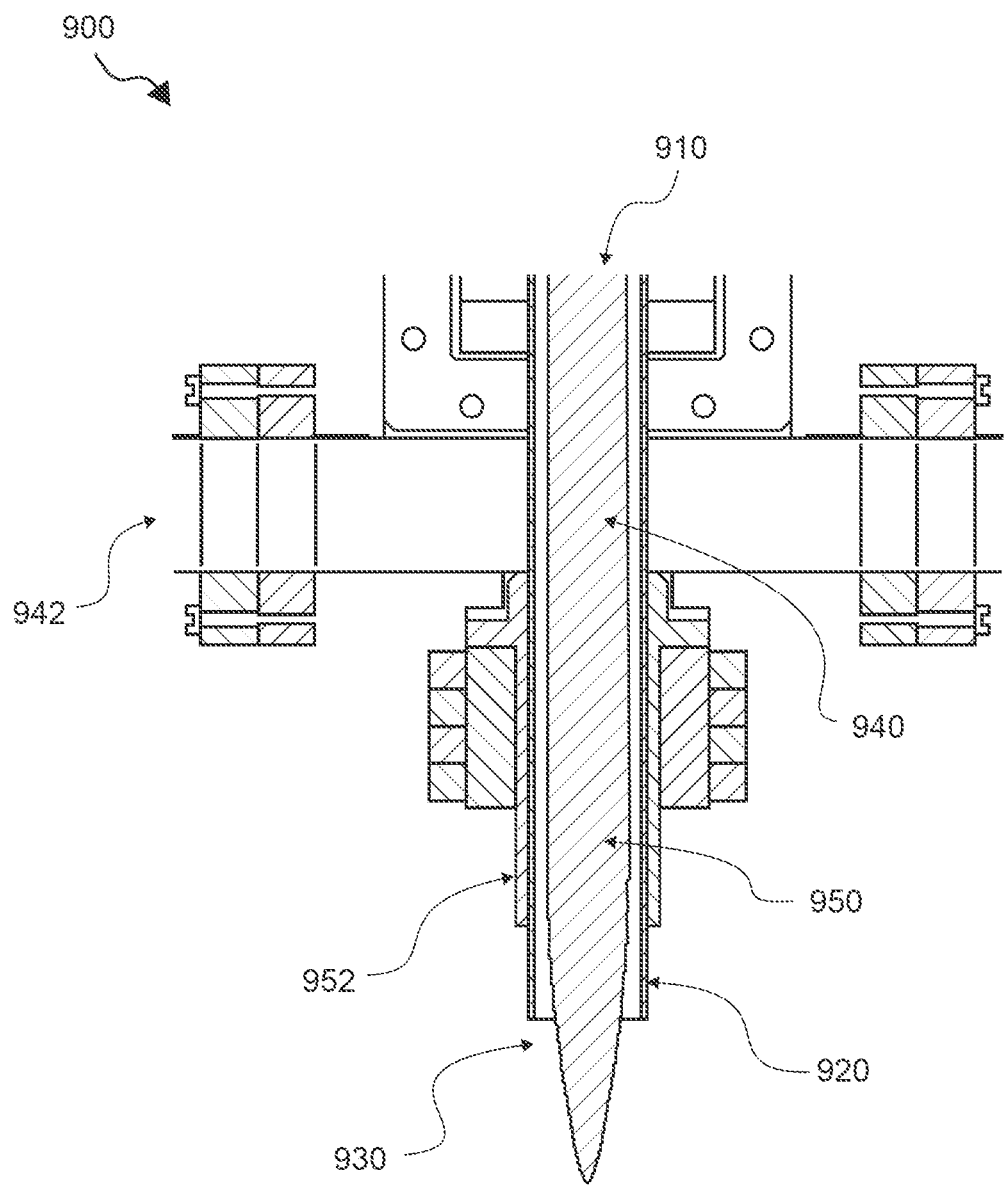
FIG. 9 illustrates another plasma generator of the inventive subject matter.

FIG. 9 depicts system 900 of the inventive subject matter. Feedstock inlet 910 provides feedstock from a source to reaction tube 920, which extends to outlet 930 and intersects reaction zones 940 and 950. In some embodiments, feedstock inlet receives feedstock that has been processed upstream (e.g., partially reformed to carbon, hydrogen, low C hydrocarbon, etc.) or a plasma (e.g., DBD plasma, glide arc plasma, induction plasma, microwave plasma, etc.), or both. Waveguide 942 directs microwaves at reaction zone 940 to form a microwave plasma (e.g., either with an igniter or by energizing/propagating a plasma extending into zone 940 from upstream) or otherwise energize a plasma.

Feedstock flows from zone 940 to reaction zone 950. In some embodiments the plasma in zone 940 resides there, though preferably the plasma from zone 940 extends or otherwise propagates to reaction zone 950. Induction coil 952 is disposed about reaction zone 950 and is insulated from the feedstock and the plasma (i.e., no electrode is exposed to feedstock or plasma in zone 950). Induction coil 952 energizes plasma from zone 940 and inductively couples with the plasma to provide feedback from the plasma system and otherwise control or manipulate the plasma in zone 950.

The feedstock is reformed as it passes through reaction tube 920, principally reformed by the plasmas of reaction zones 940 and 950 (in preferred cases a continuous plasma). Preferably reacted species or products including hydrogen and carbon exit outlet 930 for further processing, sorting, or separating, or combinations thereof. In some embodiments, further microwave or induction coils are disposed downstream of outlet 930 to further process and reform any remaining feedstock or low C hydrocarbons into desired products hydrogen or carbon.

Figure 10A:
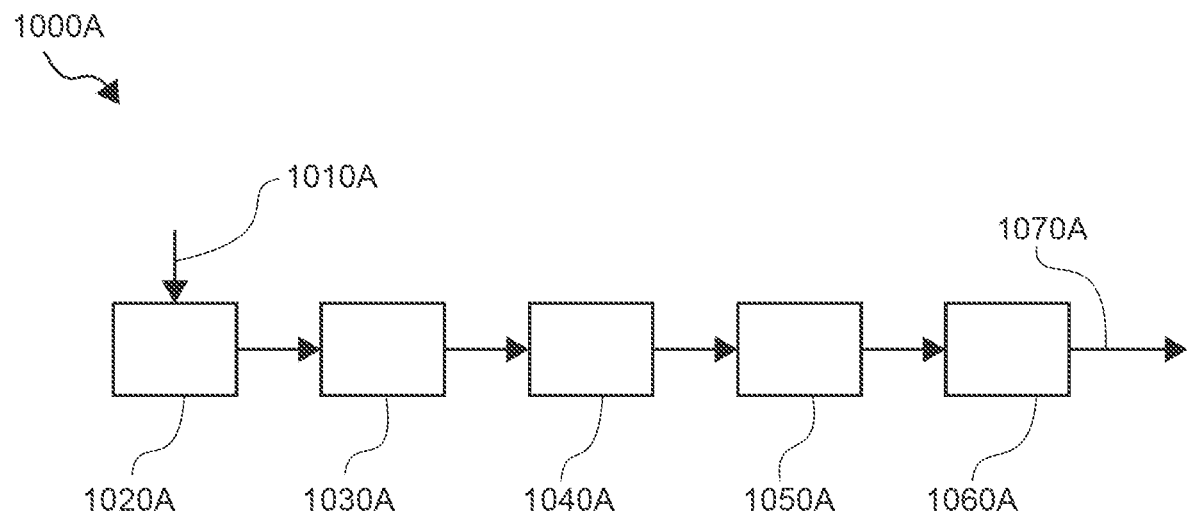
FIGS. 10A-B illustrate diagrams of various plasma generators of the inventive subject matter.

FIG. 10A depicts diagram 1000A of a system of the inventive subject matter. Feedstock inlet 1010A supplies feedstock (e.g., natural gas) to igniter 1020A. Igniter 1020A includes one or more electrodes to generate a plasma in igniter 1020A (e.g., DBD plasma, glide arc plasma, combinations thereof, etc.) as disclosed herein. Plasma from igniter 1020A and feedstock then pass to reaction zone 1030A, where an inductive coil is used to energize the plasma and form an induction plasma in zone 1030A.

Feedstock and products (e.g., hydrogen, carbon, lower C hydrocarbon), and plasma, preferably, enter reaction zone 1040A, where microwaves are directed at the zone to energize the plasma and form a microwave plasma in the zone. Feedstock and products (e.g., hydrogen, carbon, lower C hydrocarbon), and plasma, preferably, enter reaction zone 1050A, where microwaves are further directed at the zone to energize the plasma and form a microwave plasma in the zone. Feedstock and products then enter zone 1060A, where a filter either filters the products from each other and any remaining feedstock, or a directing structure further diverts the feedstock or products to separate channels for further processing. Desired products then exit outlet 1070A for collection, refining, or storing, while remaining feedstock is redirected for further processing, either by cycling back to inlet 1010A or downstream to further reaction zones.

Figure 10B:
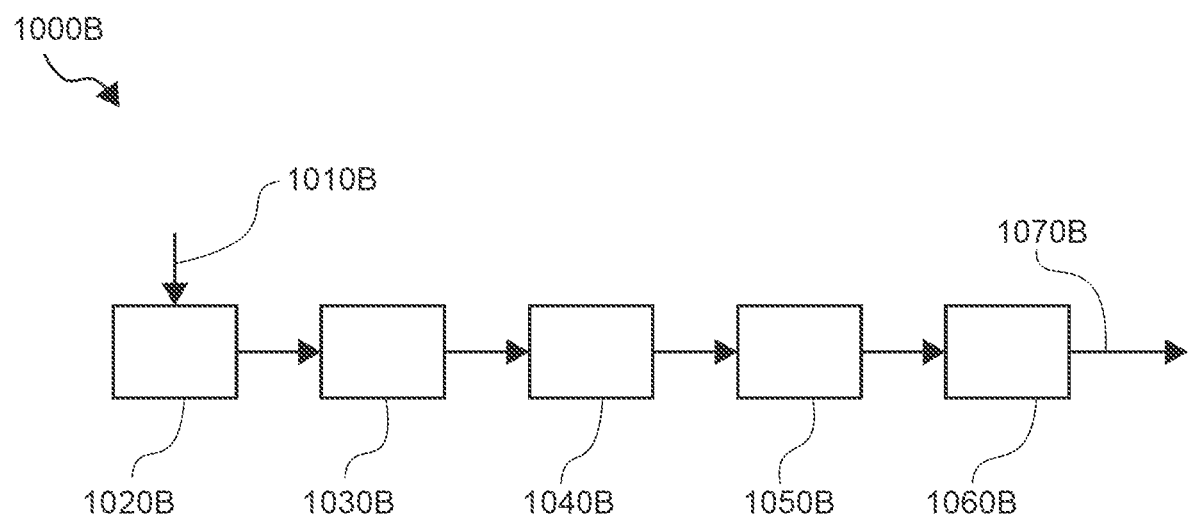

FIG. 10B depicts diagram 1000B, which demonstrates the diverse arrangement of microwave and induction plasmas contemplated by the inventive subject matter. 1010B provides feedstock to the system. Any one, or most, or all, of zones 1020B, 1030B, 1040B, 1050B, or 1060B can be a zone having an induction plasma (e.g., via inductive coils) or a microwave plasma (e.g., via microwaves), which can exist separately in each zone or extend continuously between the zones. Preferably, zone 1020B includes one or more electrodes to initiate a plasma (e.g., DBD, glide arc, etc.), while zone 1060B includes a filter to separate the desired products (hydrogen, carbon) from the remaining feedstock.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

Unless the context dictates the contrary, all ranges set forth herein should be interpreted as being inclusive of their endpoints, and open-ended ranges should be interpreted to include commercially practical values. Similarly, all lists of values should be considered as inclusive of intermediate values unless the context indicates the contrary.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

The following discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

It should be apparent to those skilled in the art that many more modifications besides those already described are possible without departing from the inventive concepts herein. The inventive subject matter, therefore, is not to be restricted except in the scope of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A plasma generator for reforming a feedstock comprising:
    a first microwave waveguide directed at a first plasma in a reaction zone; and
    a second plasma coupled with the first plasma;
    wherein the first microwave waveguide energizes the first plasma in the reaction zone.

2. The generator of claim 1, wherein an induction coil energizes the second plasma, the induction coil insulated from the second plasma.

3. The generator of claim 1, further comprising a second microwave waveguide directed at one of the first or the second plasma.

4. The generator of claim 3, wherein the second microwave waveguide energizes the first plasma and propagates the first plasma toward the second plasma.

5. The generator of claim 1, further comprising a second microwave waveguide directed at a plasma between the reaction zone and the second plasma.

6. The generator of claim 5, wherein the second microwave waveguide energizes the first plasma and propagates toward the second plasma.

7. The generator of claim 1, further comprising a second microwave waveguide directed at a plasma downstream of the second plasma.

8. The generator of claim 1, further comprising an electrode in communication with the feedstock or a product of the feedstock.

9. The generator of claim 8, wherein the electrode is disposed upstream of the reaction zone.

10. The generator of claim 8, further comprising a pair of coils upstream of the reaction zone configured to cause magnetic induction.

11. The generator of claim 10, wherein the pair of coils comprise:
    a low-turn coil; and
    a high-turn coil radially surrounded by the low-turn coil and electrically coupled to the electrode, wherein the high-turn coil has a higher turn count than the low-turn coil.

12. The generator of claim 11, wherein the low-turn coil is electrically insulated from the electrode.

13. The generator of claim 11, wherein the low-turn coil is electrically coupled to a high-voltage power supply.

14. The generator of claim 11, wherein the electrode is a first electrode, and further comprising a second electrode in communication with the feedstock or a product of the feedstock upstream of the first reaction zone and energized by the high-turn coil, wherein the first and second electrodes generate the first plasma.

15. The generator of claim 14, wherein the first electrode and second electrode are nested and extend along a common axis.

16. A plasma generator, comprising:
    an inlet configured to couple with a source of a feedstock stream;
    a reaction zone disposed downstream of the inlet, the reaction zone enclosing a volume for passthrough of the feedstock;
    an outlet disposed downstream of the reaction zone to output a reacted species;
    a first electrode disposed between the inlet and the outlet; and
    a microwave emitter directed at the reaction zone.

17. The generator of claim 16, wherein the reaction zone comprises:
    a first segment receiving the feedstock stream from the inlet; and
    a plasma in the first segment reacting with the feedstock stream to produce the reacted species;
    wherein the first segment is configured to convey the reacted species to a second segment of the reaction zone; and
    wherein the microwave emitter is directed toward the second segment.

18. The generator of claim 17, wherein the reaction zone comprises an additional segment disposed between the second segment and the outlet.

19. The generator of claim 17, further comprising a low-turn coil disposed along one of the segments of the reaction zone and a high-turn coil within the low-turn coil, wherein the high-turn coil has a higher turn count than the low-turn coil.

20. The generator of claim 19, further comprising a power source, wherein the power source, the low-turn coil, and the high-turn coil are configured to generate a magnetic field having a strength between 1,000 gauss and 100,000 gauss.

21. The generator of claim 19, wherein the high-turn coil is disposed along the first segment upstream of the second segment.

22. The generator of claim 19, wherein the high-turn coil is disposed within the volume of the reaction zone.

23. The generator of claim 16, wherein the microwave emitter is a first microwave emitter and further comprising a second microwave emitter.

24. The generator of claim 23, wherein the second microwave emitter is disposed downstream of the first microwave emitter.

25. The generator of claim 23, wherein the second microwave emitter is arranged in series with the first microwave emitter.

26. The generator of claim 23, wherein the second microwave emitter is arranged in parallel with the first microwave emitter.

27. The generator of claim 16, further comprising a filter disposed to interact with the reacted species.

28. The generator of claim 27, wherein the filter comprises a porous substrate, a permeable layer, a semi-permeable layer, a selectively permeable layer, or a gradient.

29. The generator of claim 16, further comprising a directing structure disposed to interact with the reacted species.

30. The generator of claim 29, wherein the directing structure comprises a rotor, a capillary, or a cavity.

\* \* \* \* \*